United States Patent
Yamakawa et al.

(10) Patent No.: US 8,592,030 B2
(45) Date of Patent: Nov. 26, 2013

(54) SILICONE ADHESIVE FOR SEMICONDUCTOR ELEMENT

(71) Applicant: Shin-Etsu Chemical Co., Ltd., Chiyoda-ku (JP)

(72) Inventors: Naoki Yamakawa, Takasaki (JP); Kei Miyoshi, Annaka (JP); Toshiyuki Ozai, Takasaki (JP); Yoshinori Ogawa, Kamakura (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 13/762,880

(22) Filed: Feb. 8, 2013

(65) Prior Publication Data

US 2013/0146939 A1    Jun. 13, 2013

Related U.S. Application Data

(62) Division of application No. 12/421,876, filed on Apr. 10, 2009, now abandoned.

(30) Foreign Application Priority Data

Apr. 11, 2008    (JP) .................................. 2008-103740

(51) Int. Cl.
    *B32B 5/16*    (2006.01)
(52) U.S. Cl.
    USPC ........................................................ 428/323
(58) Field of Classification Search
    USPC ........................................................ 428/323
    See application file for complete search history.

(56) References Cited

U.S. PATENT DOCUMENTS

| | | | |
|---|---|---|---|
| 7,511,424 B2 * | 3/2009 | Sofue et al. | .................... 313/512 |
| 7,807,736 B2 | 10/2010 | Kashiwagi et al. | |
| 2006/0275617 A1 | 12/2006 | Miyoshi et al. | |
| 2007/0042533 A1 | 2/2007 | Endo et al. | |
| 2009/0258216 A1 * | 10/2009 | Yamakawa et al. | ........... 428/323 |

FOREIGN PATENT DOCUMENTS

| | | |
|---|---|---|
| JP | 2002-280615 | 9/2002 |
| JP | 2005-327777 | 11/2005 |
| JP | 2006-342200 | 12/2006 |
| JP | 2007-059505 | 3/2007 |

OTHER PUBLICATIONS http://en.wikipedia.org/wiki/Titanium_dioxide Retrieved Jun. 28, 2012.

Office Action issued Sep. 18, 2012, in Japan Patent Application No. 2008-103740.

\* cited by examiner

*Primary Examiner* — Nathan M Nutter

(74) *Attorney, Agent, or Firm* — Oblon, Spivak, McClelland, Maier & Neustadt, L.L.P.

(57) ABSTRACT

A silicone adhesive for a semiconductor element that is suitable as a die bonding material for fixing a light emitting diode chip to a substrate. The adhesive includes (a) an addition reaction-curable silicone resin composition having a viscosity at 25° C. of not more than 100 Pa·s, and yielding a cured product upon heating at 150° C. for 3 hours that has a type D hardness prescribed in JIS K6253 of at least 30, (b) a white pigment powder having an average particle size of less than 1 μm, and (c) a white or colorless and transparent powder having an average particle size of at least 1 μm but less than 10 μm. The adhesive exhibits high levels of concealment, effectively reflects light emitted from the LED chip, and also exhibits favorable chip positioning properties, superior adhesive strength, and excellent durability.

20 Claims, No Drawings

SILICONE ADHESIVE FOR SEMICONDUCTOR ELEMENT

CROSS REFERENCE TO RELATED APPLICATION

This application is a divisional application of U.S. application Ser. No. 12/421,876, filed on Apr. 10, 2009, and claims priority to Japanese Patent Application No. 2008-103740, filed on Apr. 11, 2008.

BACKGROUND OF THE INVENTION

1. Field of the Invention

The present invention relates to a white die bonding material that is suitable for fixing a light emitting diode (LED) chip to a gold-plated substrate. More specifically, the invention relates to a heat-curable silicone adhesive for a semiconductor element that produces favorable chip positioning properties when a chip is pressed onto a substrate, exhibits high levels of concealment and adhesive strength, displays excellent durability, and effectively reflects light emitted from the chip.

2. Description of the Prior Art

Epoxy resins have conventionally been used as the die bonding material for fixing LED light emitting elements (chips). However, die bonding materials used for fixing blue or white LED light emitting elements (chips) tend to yellow over time upon extended use, and in a similar manner to that observed for epoxy encapsulating materials, the die bonding material tends to absorb light, causing a reduction in the brightness.

Nowadays, the demands relating to the durability of light emitting devices that use an LED as a module are even more stringent, and the LED encapsulating materials are gradually being replaced with silicone-based materials. In a similar manner to encapsulating materials, die bonding materials also require favorable durability, and it is expected that improved heat resistance will be demanded together with improved brightness. Die bonding materials formed from silicone resin compositions have already been proposed (Patent Document 1).

Silver electrodes and gold electrodes are typically used for LED electrodes, but in those cases where a silver electrode is used, oxygen permeation or the like through the encapsulating material can cause oxidation and blackening of the surface of the silver electrode, resulting in a deterioration in the light reflection efficiency. In contrast, in those cases where a gold electrode is used, because the electrode itself is inert, it offers the advantage of being unaffected by the surrounding environment. However, if a transparent silicone die bonding material such as that disclosed in Patent Document 1 is used with a gold electrode, then a problem arises in that the light emitted from the LED chip is absorbed at the gold surface, causing a deterioration in the light extraction efficiency. Accordingly, in order to improve the light extraction efficiency, for those cases where an LED chip is fixed to a gold-plated substrate, the development of a silicone die bonding material which blocks and effectively reflects light emitted from the LED chip, namely a silicone die bonding material with excellent concealment properties, has been keenly sought.

[Patent Document 1] US2006/0275617A1

DISCLOSURE OF THE INVENTION

The present invention has been developed in light of the above circumstances, and has an object of providing a silicone adhesive for a semiconductor element that exhibits a high degree of concealment, effectively reflects light emitted from LED chips, and can be used as a die bonding material.

As a result of intensive investigation aimed at achieving the above object, the inventors of the present invention discovered that the above object could be achieved by using a silicone adhesive for a semiconductor element comprising the components (a), (b) and (c) shown below:

(a) an addition reaction-curable silicone resin composition, having a viscosity at 25° C. of not more than 100 Pa·s, and yielding a cured product upon heating at 150° C. for 3 hours that has a type D hardness prescribed in JIS K6253 of at least 30, (b) a white pigment powder having an average particle size of less than 1 μm, and (c) a white or colorless and transparent powder having an average particle size of at least 1 μm but less than 10 μm, wherein the combination of the components (b) and (c) is used in an amount of 12 to 600 parts by mass per 100 parts by mass of the component (a).

Furthermore, the present invention provides a light emitting device comprising a substrate (e.g., in particular, a gold-plated substrate), a light emitting element and a cured resin layer interposed between the substrate and the light emitting element, wherein said cured resin layer comprises a cured product of a silicone adhesive comprising components (a), (b) and (c) shown below:

(a) an addition reaction-curable silicone resin composition, having a viscosity at 25° C. of not more than 100 Pa·s, and yielding a cured product upon heating at 150° C. for 3 hours that has a type D hardness prescribed in JIS K6253 of at least 30, (b) a white pigment powder having an average particle size of less than 1 μm, and (c) a white or colorless and transparent powder having an average particle size of at least 1 μm but less than 10 μm, wherein a combination of components (b) and (c) is used in an amount of 12 to 600 parts by mass per 100 parts by mass of component (a).

The present invention is able to provide a silicone adhesive for a semiconductor element that exhibits a high degree of concealment and effectively reflects light emitted from LED chips, thereby improving the light extraction efficiency. This adhesive also produces favorable chip positioning properties, and exhibits a high level of adhesive strength and excellent durability. Incidentally, herein, what is meant by the adhesive having favorable chip positioning properties, is that when a tip is placed and pressed on the adhesive applied on a substrate, the chip can be placed well at a desired position without deviation, lift or the like.

DETAILED DESCRIPTION OF THE PREFERRED EMBODIMENTS

A more detailed description of each of the components is presented below. In the following description and the description of the claims, "type D hardness" refers to the hardness measured using a D-type durometer prescribed in JIS K6253. Furthermore, in the following description, unless stated otherwise, viscosity values refer to values measured at 25° C. using a rotational viscometer such as a BM-type rotational viscometer. Furthermore, Vi represents a vinyl group and Me represents a methyl group.

[Component (a)]

The component (a) is an addition reaction-curable silicone resin composition, having a viscosity at 25° C. of not more than 100 Pa·s, typically within a range from 1 to 100 Pa·s, and preferably from 1 to 10 Pa·s, and yielding a cured product upon heating at 150° C. for 3 hours that has a type D hardness prescribed in JIS K6253 of at least 30, typically within a range from 30 to 90, and preferably from 40 to 90. The resin composition usually comprises a main component formed from an organopolysiloxane containing two or more alkenyl groups, a cross-linking agent formed from an organohydrogenpolysiloxane containing at least two SiH bonds, and a reaction catalyst formed from a platinum group metal-based catalyst.

In a preferred aspect of the present invention, the component (a) is composed of a composition comprising the components (A), (B), (C) and (D) described below:

(A) an organopolysiloxane having at least two alkenyl groups bonded to silicon atoms within each molecule, and having a viscosity at 25° C. of not more than 1,000 mPa·s, (B) a polyorganosiloxane represented by an average composition formula (1) shown below:

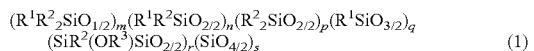

$(R^1R^2_2SiO_{1/2})_m(R^1R^2SiO_{2/2})_n(R^2_2SiO_{2/2})_p(R^1SiO_{3/2})_q(SiR^2(OR^3)SiO_{2/2})_r(SiO_{4/2})_s$   (1)

[wherein $R^1$ represents an alkenyl group (for example, an alkenyl group of 2 to 6 carbon atoms, and preferably 2 to 4 carbon atoms, such as a vinyl group, allyl group, propenyl group or butenyl group) or a monovalent hydrocarbon group other than an alkenyl group (for example, a monovalent hydrocarbon group of 1 to 10 carbon atoms, and preferably 1 to 8 carbon atoms, including an alkyl group such as a methyl group, ethyl group or propyl group, an aryl group such as a phenyl group, or an aralkyl group such as a benzyl group); $R^2$ represents a monovalent hydrocarbon group that does not contain an alkenyl group, provided that at least 80% of $R^2$ groups are methyl groups; $R^3$ represents a hydrogen atom or an alkyl group; m, n, p, q, r and s are numbers that satisfy m≥0, n≥0, p≥0, q≥0, r≥0 and s≥0 respectively, provided that m+n>0, q+r+s>0, and m+n+p+q+r=1, and in a preferred configuration, m is a number from 0 to 0.65, n is a number from 0 to 0.5, p is a number from 0 to 0.5, q is a number from 0 to 0.8, r is a number from 0 to 0.8, and s is a number from 0 to 0.6], which at 25° C. is either a liquid having a viscosity of at least 1,000 Pa·s or a solid, in an amount that provides 60 to 90 parts by mass of component (B) per 100 parts by mass of the combination of component (A) and component (B), (C) an organohydrogenpolysiloxane represented by an average composition formula (2) shown below:

$R^4_aH_bSiO_{(4-a-b)/2}$   (2)

(wherein $R^4$ represents a monovalent hydrocarbon group other than an alkenyl group, and at least 50% of $R^4$ groups are methyl groups; and a and b are positive numbers that satisfy 0.7≤a≤2.1, 0.001≤b≤1.0 and 0.8≤a+b≤3.0, and preferably satisfy 1.0≤a≤2.0, 0.01≤b≤1.0 and 1.1≤a+b≤2.6), having at least two, and preferably three or more, SiH bonds within each molecule, and having a viscosity at 25° C. of not more than 1,000 mPa·s, in an amount that yields a total number of SiH bonds that is 0.5 to 5.0 times the total number of alkenyl groups within the combination of component (A) and component (B), and (D) an effective amount of a platinum group metal-based catalyst.

A description of each of these components is presented below.

—Component (A)—

The component (A) is a component that is required for imparting post-curing stress relaxation within the silicone resin composition that functions as the component (a) of the silicone adhesive of the present invention. The component (A) is a linear organopolysiloxane having at least two alkenyl groups bonded to silicon atoms within each molecule, in which the main chain is composed essentially of repeating diorganosiloxane units and both the molecular chain terminals are blocked with triorganosiloxy groups. Examples of the component (A) include organopolysiloxanes represented by the formulas shown below:

$ViR_2SiO(SiR_2O)_nSiR_2Vi$,

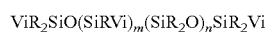

$ViR_2SiO(SiRVi)_m(SiR_2O)_nSiR_2Vi$

$(Vi)_2(R)SiO[Si(R)_2O]_nSi(R)(Vi)_2$

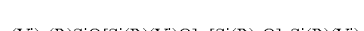

$(Vi)_3SiO[Si(R)_2O]_nSi(Vi)_3$

$(Vi)_2(R)SiO[Si(R)(Vi)O]_m[Si(R)_2O]_nSi(R)(Vi)_2$

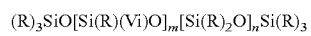

$(Vi)_3SiO[Si(R)(Vi)O]_m[Si(R)_2O]_nSi(Vi)_3$ $(R)_3SiO[Si(R)(Vi)O]_m[Si(R)_2O]_nSi(R)_3$ (wherein, R represents a monovalent hydrocarbon group that contains neither an aliphatic unsaturated group nor an aryl group, and preferably contains not more than 10 carbon atoms, m is an integer of 0 to 5, and n is an integer of 0 to 200). From the viewpoints of light resistance and heat resistance, R is most preferably a methyl group.

Specific examples of the component (A) include the compounds shown below.

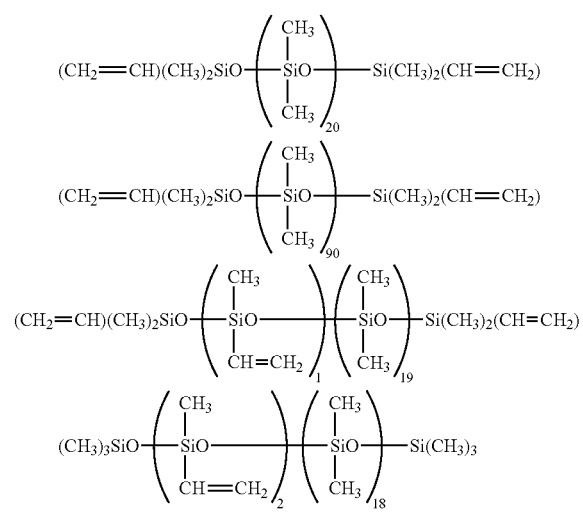

The viscosity of the component (A) must be not more than 1,000 mPa·s at 25° C. If a compound with a viscosity exceeding this limit is used, then the degree of cross-linking within the cured product obtained upon curing the adhesive of the present invention is inadequate, and achieving the desired high degree of hardness becomes difficult. The viscosity is preferably not more than 700 mPa·s (typically from 10 to 700 mPa·s), and is more preferably within a range from 20 to 200 mPa·s.

—Component (B)—

The component (B) is required for providing reinforcement while retaining the colorless transparency of the silicone resin composition of the component (a). Specifically, the component (B) is a polyorganosiloxane represented by an average composition formula (1) shown below:

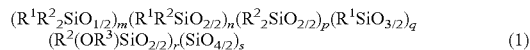  (1)

(wherein $R^1$, $R^2$, $R^3$, m, n, p, q, r and s are as defined above for formula (1)), which at 25° C. is either a liquid having a viscosity of at least 1,000 Pa·s, or a solid. In terms of availability and cost, the alkenyl groups within this component are most preferably vinyl groups. The amount of alkenyl groups is preferably within a range from 0.01 to 1 mol/100 g relative to the solid fraction of the component (B). If the amount of alkenyl groups is less than 0.01 mol/100 g, then this component is not adequately incorporated within the cross-linking process, and as a result, a silicone adhesive capable of producing a cured product with the desired high degree of hardness is unobtainable. In contrast, if the amount of alkenyl groups exceeds 1 mol/100 g, then because the total number of alkenyl groups within the system increases significantly, the cross-linking process does not proceed satisfactorily with the small amount of the cross-linking agent (component (C)) described below, meaning the desired degree of hardness cannot be achieved. If the amount of the cross-linking agent is increased, then this results in a reduction in the concentration of the component (B), which tends to make the resulting cured product more brittle. For these reasons, the amount of alkenyl groups within the component (B) is more preferably within a range from 0.05 to 0.5 mol/100 g.

The ratio of the component (B) relative to the component (A) is an important factor within this composition. The blend amount of the component (B) must be within a range from 60 to 90 parts by mass, and is preferably from 70 to 80 parts by mass, per 100 parts by mass of the combination of the component (A) and the component (B). If the blend amount of the component (B) is less than 60 parts by mass, then the desired degree of hardness may be unattainable, whereas if the quantity exceeds 90 parts by mass, then the cured product of the resulting silicone resin composition becomes extremely brittle, meaning the silicone adhesive comprising the composition is no longer suitable as a die bonding material for LED elements.

—Component (C)—

The component (C) is an organohydrogenpolysiloxane represented by the average composition formula (2) shown below:

$$R^4{}_aH_bSiO_{(4-a-b)/2}$$ (2)

(wherein $R^4$, a and b are as defined above for formula (2)), having at least two SiH bonds (namely, hydrogen atoms bonded to silicon atoms, or hydrosilyl groups) within each molecule, and having a viscosity at 25° C. of not more than 1,000 mPa·s.

This component functions as a cross-linking agent that undergoes cross-linking with the alkenyl groups within the component (A) and the component (B) via a hydrosilylation reaction, and also functions as a reactive diluent that dilutes the component (B) to a viscosity best suited to the intended application.

For these reasons, the viscosity of this component at 25° C. is not more than 1,000 mPa·s, is typically within a range from 0.5 to 1,000 mPa·s, and is preferably from 2 to 200 mPa·s. Further, in order to achieve balanced cross-linking, the amount of the component (C) is controlled so as to provide a total number of SiH bonds that is 0.5 to 5.0 times, and preferably 0.7 to 3.0 times, the total number of alkenyl groups within the combination of the component (A) and the component (B).

The two or more (typically from 2 to 200), preferably three or more (for example, 3 to 100), and still more preferably 4 to approximately 50 SiH groups within each molecule may be positioned either at the molecular chain terminals or at non-terminal positions within the molecular chain, or may also be positioned at both these locations. Furthermore, the molecular structure of this organohydrogenpolysiloxane may be any one of a linear, cyclic, branched, or three dimensional network structure, although the number of silicon atoms within a single molecule (or the polymerization degree) is typically within a range from 2 to 200, preferably from 3 to 100, and even more preferably from 4 to approximately 50.

In the formula (2), $R^4$ represents a monovalent hydrocarbon group other than an alkenyl group, and this $R^4$ group typically contains from 1 to 10 carbon atoms, and preferably from 1 to 8 carbon atoms. Specific examples of $R^4$ include alkyl groups such as a methyl group, ethyl group, propyl group, isopropyl group, butyl group, isobutyl group, tert-butyl group, pentyl group, neopentyl group, hexyl group, cyclohexyl group, octyl group, nonyl group or decyl group; aryl groups such as a phenyl group, tolyl group, xylyl group or naphthyl group, and aralkyl groups such as a benzyl group, phenylethyl group or phenylpropyl group. Of these, a methyl group or phenyl group is particularly desirable.

Specific examples of the organohydrogenpolysiloxane of the above formula (2) include 1,1,3,3-tetramethyldisiloxane, 1,3,5,7-tetramethylcyclotetrasiloxane, tris(hydrogendimethylsiloxy)methylsilane, tris(hydrogendimethylsiloxy)phenylsilane, methylhydrogencyclopolysiloxane, cyclic copolymers of methylhydrogensiloxane and dimethylsiloxane, methylhydrogenpolysiloxane with both molecular chain terminals blocked with trimethylsiloxy groups, copolymers of dimethylsiloxane and methylhydrogensiloxane with both terminals blocked with trimethylsiloxy groups, dimethylpolysiloxane with both terminals blocked with dimethylhydrogensiloxy groups, methylhydrogenpolysiloxane with both terminals blocked with dimethylhydrogensiloxy groups, copolymers of dimethylsiloxane and methylhydrogensiloxane with both terminals blocked with dimethylhydrogensiloxy groups, copolymers of methylhydrogensiloxane and diphenylsiloxane with both terminals blocked with trimethylsiloxy groups, copolymers of methylhydrogensiloxane, diphenylsiloxane and dimethylsiloxane with both terminals blocked with trimethylsiloxy groups, copolymers of methylhydrogensiloxane, methylphenylsiloxane and dimethylsiloxane with both terminals blocked with trimethylsiloxy groups, copolymers of methylhydrogensiloxane, dimethylsiloxane and diphenylsiloxane with both terminals blocked with dimethylhydrogensiloxy groups, copolymers of methylhydrogensiloxane, dimethylsiloxane and methylphenylsiloxane with both terminals blocked with dimethylhydrogensiloxy groups, copolymers composed of $(CH_3)_2HSiO_{1/2}$ units, $(CH_3)_3SiO_{1/2}$ units and $SiO_{4/2}$ units, copolymers composed of $(CH_3)_2HSiO_{1/2}$ units and $SiO_{4/2}$ units, and copolymers composed of $(CH_3)_2HSiO_{1/2}$ units, $SiO_{4/2}$ units and $(C_6H_5)_3SiO_{1/2}$ units, as well as compounds in which some or all of the methyl groups within each of the above compounds have been substituted with phenyl groups.

Specific examples of the component (C) include compounds represented by the formula shown below:

(wherein, n is an integer of 2 to 100, and preferably 2 to 20), and cyclic siloxanes represented by the formula shown below.

—Component (D)—

The component (D) is a reaction catalyst for accelerating the reaction between the components (A) and (B), and the component (C), and is an effective amount of a platinum group metal-based catalyst.

Any of the conventional hydrosilylation reaction catalysts can be used as this platinum group metal-based catalyst. Specific examples include platinum group metals such as platinum black, rhodium and palladium; platinum chlorides such as $H_2PtCl_4 \cdot nH_2O$, $H_2PtCl_6 \cdot nH_2O$, $NaHPtCl_6 \cdot nH_2O$, $KHPtCl_6 \cdot nH_2O$, $Na_2PtCl_6 \cdot nH_2O$, $K_2PtCl_4 \cdot nH_2O$, $PtCl_4 \cdot nH_2O$, $PtCl_2$ and $Na_2HPtCl_4 \cdot nH_2O$ (wherein, n represents an integer of 0 to 6, and is preferably either 0 or 6); chloroplatinic acid and chloroplatinates; alcohol-modified chloroplatinic acid (see U.S. Pat. No. 3,220,972); complexes of chloroplatinic acid and olefins (see U.S. Pat. Nos. 3,159,601, 3,159,662 and 3,775,452); a platinum group metal such as platinum black or palladium supported on a carrier such as alumina, silica or carbon; rhodium-olefin complexes; chlorotris(triphenylphosphine)rhodium (Wilkinson's catalyst); and complexes of platinum chloride, chloroplatinic acid or a chloroplatinate with a vinyl group-containing siloxane and particularly a vinyl group-containing cyclic siloxane. Of these, from the viewpoints of compatibility and reducing chlorine impurities, silicone-modified chloroplatinic acid materials are preferred, and a specific example is a platinum catalyst prepared by modifying chloroplatinic acid with tetramethylvinyldisiloxane. The amount added of the component (D), reported as an equivalent mass of platinum metal within the component (a), is typically within a range from 1 to 500 ppm, preferably from 3 to 100 ppm, and still more preferably from 5 to 40 ppm.

In another preferred aspect of the present invention, the component (a) is composed of a composition comprising the components (P), (Q) and (R) described below:

(P) an organopolysiloxane represented by an average composition formula (3) shown below:

$$R_x(C_6H_5)_y SiO_{(4-x-y)/2} \qquad (3)$$

(wherein R represents identical or different, unsubstituted or substituted monovalent hydrocarbon groups or alkoxy groups, or a hydroxyl group, provided that 0.1 to 80 mol % of all R groups are alkenyl groups; and x and y are positive numbers that satisfy $1 \le x+y < 2$ and $0.20 \le y/(x+y) \le 0.95$), which at 25° C. is either a liquid having a viscosity of at least 100 mPa·s, or a solid, (Q) an organohydrogenpolysiloxane represented by an average composition formula (4) shown below:

$$R'_c H_d SiO_{(4-c-d)/2} \qquad (4)$$

(wherein R' represents identical or different, substituted or unsubstituted monovalent hydrocarbon groups other than aliphatic unsaturated hydrocarbon groups; and c and d are positive numbers that satisfy $0.7 \le c \le 2.1$, $0.002 \le d \le 1.0$ and $0.8 \le c+d \le 2.6$), having at least two Si—H bonds within each molecule, and having a viscosity at 25° C. of not more than 1,000 mPa·s, wherein at least 5 mol % of the total number of R' groups and silicon atom-bonded H atoms within the composition formula (4) are phenyl groups, and (R) an effective amount of a platinum group metal-based catalyst.

—Component (P)—

The component (P) is a component for improving the mechanical strength of the cured product obtained upon curing the silicone adhesive of the present invention. This component (P) is an organopolysiloxane represented by the average composition formula (3):

$$R_x(C_6H_5)_y SiO_{[(4-x-y)/2]} \qquad (3)$$

(wherein R, x and y are as defined above for formula (3)), which at 25° C. is either a liquid having a viscosity of at least 100 mPa·s, and preferably 100 Pa·s or more, or a solid.

As is evident from the fact that $1 \le x+y \le 2$ in the formula (3), this organopolysiloxane is a branched or three dimensional network structure comprising one or more $RSiO_{3/2}$ units, $(C_6H_5)SiO_{3/2}$ units or $SiO_2$ units within the molecule.

In the formula (3), R preferably represents identical or different, substituted or unsubstituted monovalent hydrocarbon groups or alkoxy groups of 1 to 20 carbon atoms, and more preferably 1 to 10 carbon atoms, or a hydroxyl group. Specific examples of these types of hydrocarbon groups include saturated hydrocarbon groups, including alkyl groups such as a methyl group, ethyl group, propyl group, isopropyl group, butyl group, tert-butyl group or hexyl group, and cycloalkyl groups such as a cyclohexyl group; aryl groups other than a phenyl group, such as a tolyl group, xylyl group or naphthyl group; aralkyl groups such as a benzyl group or phenylethyl group; unsaturated hydrocarbon groups including alkenyl groups such as a vinyl group, allyl group, propenyl group, isopropenyl group or butenyl group; halogenated hydrocarbon groups such as a 3,3,3-trifluoropropyl group; and cyano-substituted hydrocarbon groups. Examples of the alkoxy group include unsubstituted alkoxy groups such as a methoxy group, ethoxy group, propoxy group or phenoxy group, and alkoxy-substituted alkoxy groups such as a methoxyethoxy group or ethoxyethoxy group. Of all the R groups, 0.1 to 80 mol %, and preferably 0.5 to 50 mol %, are alkenyl groups. If the alkenyl group content is less than 0.1 mol %, then the hardness following curing is inadequate for a silicone adhesive, whereas if the alkenyl group content exceeds 80 mol %, then the number of cross-linking points becomes excessively high, and the cured product tends to become brittle. Furthermore, x and y are positive numbers that satisfy $1 \le x+y < 2$ and preferably $1.2 \le x+y \le 1.9$, and also satisfy $0.20 \le y/(x+y) \le 0.95$ and preferably $0.25 \le y/(x+y) \le 0.90$. If the value of x+y is less than 1, or 2 or greater, then the hardness and strength of the cured product tend to be unsatisfactory. Furthermore, if the phenyl group content, represented by $y/(x+y)$ is less than 0.25, then the hardness and strength of the cured product tend to be unsatisfactory. If the value of $y/(x+y)$ exceeds 0.90, then the strength of the cured product deteriorates.

—Component (Q)—

The component (Q) is an organohydrogenpolysiloxane that forms cross-linking via a hydrosilylation reaction with the alkenyl groups contained within the component (P). The component (Q) functions as a cross-linking agent, and also functions as a reactive diluent. The organohydrogenpolysiloxane is a compound represented by the average composition formula (4) shown below:

$$R'_c H_d SiO_{(4-c-d)/2} \qquad (4)$$

(wherein R', c and d are as defined above for the formula (4)), having at least two (typically from 2 to 200), preferably three or more (for example, 3 to 100), and still more preferably 4 to approximately 50 Si—H bonds (namely, hydrogen atoms bonded to silicon atoms) within each molecule, and having a viscosity at 25° C. of not more than 1,000 mPa·s, wherein at least 5 mol % of the total number of silicon atom-bonded R' groups and H atoms are phenyl groups. The component (Q) is preferably essentially a linear organohydrogenpolysiloxane, although cyclic, branched or three dimensional network structures may also be used. The number of silicon atoms within a single molecule (or the polymerization degree) is typically within a range from 4 to 200, preferably from 4 to 100, and even more preferably from 4 to approximately 50.

R' represents identical or different, substituted or unsubstituted monovalent hydrocarbon groups other than aliphatic unsaturated hydrocarbon groups, which preferably contain 1 to 20 carbon atoms, and still more preferably 1 to 10 carbon atoms. Specific examples of these types of hydrocarbon groups include saturated hydrocarbon groups, including alkyl groups such as a methyl group, ethyl group, propyl group, isopropyl group, butyl group, tert-butyl group or hexyl group, and cycloalkyl groups such as a cyclohexyl group; aryl groups such as a phenyl group or tolyl group; aralkyl groups such as a benzyl group or phenylethyl group; halogenated hydrocarbon groups such as a 3,3,3-trifluoropropyl group; and cyano-substituted hydrocarbon groups. A phenyl group or methyl group is particularly preferred as R'.

Furthermore, c is a positive number that satisfies $0.7 \leq c \leq 2.1$, and preferably satisfies $1.0 \leq c \leq 1.8$. d is a positive number that satisfies $0.002 \leq d \leq 1.0$, preferably satisfies $0.02 \leq d \leq 1.0$, and still more preferably satisfies $0.10 \leq d \leq 1.0$. Moreover, c and d also satisfy $0.8 \leq c+d \leq 2.6$, preferably satisfy $1.01 \leq c+d \leq 2.4$, and still more preferably satisfy $1.6 \leq c+d \leq 2.2$. If d is less than 0.002, then sufficient hardness tends to be unobtainable when the adhesive of the present invention is cured. In contrast, if d exceeds 1.0, then the compatibility of the component (Q) with the component (P) deteriorates, and there is a possibility of phase separation. At values of c+d less than 0.8, the viscosity increases dramatically, and the action of the component (Q) as a reactive diluent tends to be lost. In contrast, if c+d exceeds 2.6, then the cured product becomes brittle.

In the case of this aspect, in order to achieve favorable compatibility with the component (P) and favorable physical properties for the cured product, this organohydrogenpolysiloxane is preferably a compound in which at least 5 mol %, and preferably 10 to 50 mol %, of all the silicon atom-bonded R' groups and H atoms (hydrogen atoms) are phenyl groups. Alternatively, an organohydrogenpolysiloxane mixture containing an organohydrogenpolysiloxane in which at least 15 mol %, and typically 15 to 70 mol %, and preferably 20 to 50 mol %, of all the silicon atom-bonded R' groups and H atoms (hydrogen atoms) are phenyl groups, and an organohydrogenpolysiloxane in which less than 15 mol %, and typically 0 to 14 mol %, and preferably 1 to 10 mol %, of all the silicon atom-bonded R' groups and H atoms (hydrogen atoms) are phenyl groups, in a weight ratio of 1:9 to 9:1, and preferably 2:8 to 8:2, can also be used favorably. The R' groups other than the phenyl groups are most preferably methyl groups.

Furthermore, the viscosity of the organohydrogenpolysiloxane of the component (Q) is as defined above. The lower limit for the viscosity is typically 0.5 mPa·s at 25° C., meaning that at 25° C., the viscosity is typically within a range from 0.5 to 1,000 mPa·s, and is preferably from 1 to 500 mPa·s.

The blend amount of the organohydrogenpolysiloxane of the component (Q) is typically within a range from 10 to 100 parts by mass, and is preferably from 15 to 80 parts by mass, per 100 parts by mass of the component (P). If this blend amount is less than 10 parts by mass, then the low viscosity suitable for molding cannot be achieved, whereas if the blend amount exceeds 100 parts by mass, then the cured product obtained upon curing the adhesive of the present invention does not exhibit satisfactory hardness or strength.

Furthermore, the organohydrogenpolysiloxane of this component (Q) may also be added in an amount that provides a molar ratio of the silicon atom-bonded hydrogen atoms (namely, SiH groups) within the component (Q) relative to the alkenyl groups within the component (P) of 0.5 to 5 mol/mol, and preferably 1 to 3 mol/mol. Specific examples of the organohydrogenpolysiloxane of the component (Q) include the same compounds as those described above in relation to the component (C) (provided that the compound includes 4 or more silicon atoms).

—Component (R)—

The component (R) is used for accelerating the reaction between the components (P) and (Q), and is an effective amount of a platinum group metal-based catalyst. The same catalysts as those listed above for the component (D) can be used as the platinum group metal-based catalyst, although from the viewpoints of compatibility and reducing chlorine impurities, silicone-modified chloroplatinic acid materials are preferred, and a specific example is a platinum catalyst prepared by modifying chloroplatinic acid with tetramethylvinyldisiloxane. The amount added of the component (R), reported as an equivalent mass of platinum metal within the component (a), is typically within a range from 1 to 500 ppm, preferably from 3 to 100 ppm, and still more preferably from 5 to 40 ppm.

[Component (b)]

The component (b) is a pigment powder used for coloring the silicone adhesive a white color, and powders that yield a transparent mixture when added to the composition of the present invention are not suitable.

Examples of the pigment powder used for coloring the silicone adhesive a white color include titanium oxide, zinc oxide, white lead, zinc sulfide, calcium carbonate and kaolin, although from the viewpoint of achieving a balance between opacifying strength, coloring strength and light reflectance, titanium oxide or zinc oxide is preferred, and titanium oxide is particularly desirable.

From the viewpoint of the concealment properties achieved, the average particle size of the white pigment powder must be less than 1 μm, and is preferably within a range from 0.01 to 0.9 μm, and more preferably from 0.1 to 0.3 μm. Here, the "average particle size" refers to the accumulated weight average size $D_{50}$ (or the median size) measured using a particle size distribution analyzer that employs a laser diffraction method.

The blend amount of the component (b) is preferably within a range from 10 to 200 parts by mass, and is preferably from 20 to 150 parts by mass, per 100 parts by mass of the component (a). If the amount of the component (b) is too large, then the viscosity of the resulting silicone adhesive becomes too high, and the composition tends to develop trailing threads, meaning application of the adhesive by stamping becomes problematic. In contrast, if the amount of the white pigment powder is too small, then the coloring strength is weak, and the desired level of concealment may be unobtainable.

[Component (c)]

The component (c) is a powder that is used as a spacer for ensuring that the thickness of the white silicone adhesive layer remains constant between substrates, and has the purpose of maintaining the white coloring of the composition even when the adhesive layer is thin. In addition, the component (c) is also added to the composition for the purpose of improving the positioning properties when an LED light emitting element is pressed down onto the adhesive. Because the component (c) is used to regulate the thickness of the adhesive layer, the average particle size of the component (c) must be larger than that of the component (b), and the average particle size is therefore at least 1 μm. On the other hand, the maximum value for the average particle size of the component (c) is typically less than 10 μm and is preferably not more than 9 μm, and an average particle size within a range from 1 to 5 μm is particularly desirable. In the same manner as that described for the component (b), the "average particle size" for the component (c) refers to the accumulated weight average size $D_{50}$ (or the median size) measured using a particle size distribution analyzer that employs a laser diffraction method. If the average particle size of the component (c) is too large, then although the thickness of the adhesive layer increases, providing superior concealment properties, a major drawback arises in that the heat radiating properties for the heat generated from the bonded LED element tend to deteriorate. When a light emitting element is bonded by pressing the element onto the adhesive layer, the thickness of the adhesive layer is preferably not more than 30 and is more preferably within a range from 5 to 10 μm. Examples of the powder of the component (c) include ceramic powders such as metal oxide powders like crystalline silica, fused silica or alumina, and because it is undesirable that the silicone adhesive layer loses its white coloring upon addition of the component (c), a white or colorless powder is preferred. Furthermore, if consideration is also given to the concealment and heat radiating properties, then the use of an alumina powder is particularly desirable. The alumina may be composed of sub-angular particles, flake-like particles or spherical particles, although for reasons including the fill properties relative to the silicone, and the positioning properties of the light emitting element, flake-like particles are particularly effective.

The blend amount of the component (c) is preferably within a range from 2 to 400 parts by mass, and is more preferably from 5 to 200 parts by mass, per 100 parts by mass of the component (a).

The blend ratio between the components (b) and (c) is preferably such that the mass ratio of the component (b) relative to the component (c) is within a range from 0.1 to 20, more preferably from 0.2 to 10, and still more preferably from 0.5 to 5. As the proportion of the component (b) having the smaller particle size is increased, trailing threads become more significant, whereas if the proportion of the component (c) having the larger particle size is increased, then because the alumina or the like of the component (c) has a lower degree of whiteness than the white powder such as the titanium oxide of the component (b), the concealment properties tend to deteriorate. The combined amount of the component (b) and the component (c) per 100 parts by mass of the component (a) is typically within a range from 12 to 600 parts by mass, preferably from 25 to 350 parts by mass, and more preferably from 40 to 350 parts by mass.

When either the component (b) or the component (c) is used alone, absolutely no concealment is obtained upon curing, meaning the component (b) and the component (c) must be used in combination. If only the component (b) is added to the component (a), then although an extremely white adhesive is obtained, because the adhesive layer lacks thickness when a light emitting element is pressed onto the adhesive, almost no concealment effect is achieved. Further, if only the component (c) is added to the component (a), then the adhesive tends to have a gray-white color, and once again, when a light emitting element is bonded to the adhesive, no concealment effect is obtained.

[Other Components]

Other components such as those described below may also be added to the silicone adhesive of the present invention, provided they do not impair the effects of the present invention. These other components include viscosity control agents such as petroleum-based solvents and silicone-based non-functional oils; adhesion improvers such as carbon functional silanes and silicone compounds that have been modified with an epoxy group, Si—H group, Si-Vi group or alkoxy group or the like (and may be modified with a single type of group or a plurality of different types of group); and components for controlling the curing rate such as tetramethyltetravinylcyclosiloxane, acetylene alcohol compounds typified by ethynylcyclohexanol, and triallyl isocyanurate or modified products thereof Furthermore, in order to improve the heat resistance durability, compounds such as hindered amines, antioxidants and polymerization inhibitors may also be added.

Although there are no particular restrictions on the curing conditions used for the silicone adhesive of the present invention, curing is preferably conducted at 120 to 180° C. for a period of 60 to 180 minutes.

Examples of semiconductor elements to which the silicone adhesive of the present invention may be applied include light emitting diode (LED) chips.

The present invention is described in more detail below using a series of examples and comparative examples, but the present invention is in no way limited by the examples presented below.

EXAMPLES

Example 1

(1) A linear dimethylpolysiloxane (A1) with both terminals blocked with vinyl groups and having a viscosity at 25° C. of 70 mP·s, a toluene solution of a silicone resin (B1) composed of $Me_3SiO_{1/2}$, $ViMe_2SiO_{1/2}$ (wherein Vi represents a vinyl group, this definition also applies below) and $SiO_{4/2}$ units, with a molar ratio of the combination of the $Me_3SiO_{1/2}$ and $ViMe_2SiO_{1/2}$ units relative to the $SiO_{4/2}$ units of 0.8, and having an amount of vinyl groups relative to the solid fraction of 0.085 mols/100 g, and a methylhydrogensiloxane (C1) of the above average composition formula (2): $R^4_aH_bSiO_{(4-a-b)/2}$ wherein $R^4$ represents a methyl group, a=1.44 and b=0.78, with both terminals blocked with trimethylsiloxy groups, and having a viscosity at 25° C. of 7.5 mPa·s were mixed together in a solid fraction equivalent mass ratio of 25:75:10. The toluene was removed from the resulting mixture by treatment at 120° C. under a reduced pressure of not more than 10 mmHg, thereby yielding a viscous liquid at room temperature.

(2) 100 parts by mass of this liquid was mixed with 3 parts by mass of tetramethyltetravinyltetracyclosiloxane and 5 parts by mass of the epoxy group-containing siloxane compound represented by a structural formula (5) shown below,

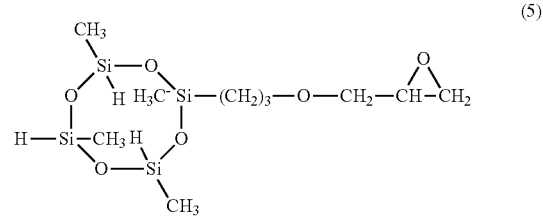

(5)

yielding a transparent liquid with a viscosity of 5 Pa·s (silicone base 1, molar ratio of total SiH groups relative to total alkenyl groups within the composition: 1.65).

(3) To 100 parts by mass of this silicone base 1 were added 50 parts by mass of a spherical titanium oxide powder (b1) having an average particle size of 0.26 μm (product name: R-820, manufactured by Ishihara Sangyo Kaisha, Ltd.), 10 parts by mass of a crystalline silica (c1) having an average particle size of 2.0 μm (product name: NIN-SIL-5, manufactured by U.S. Silica Company), and a platinum catalyst (D1) derived from chloroplatinic acid and having tetramethylvinyldisiloxane as a ligand, in sufficient amount to provide the equivalent of 10 ppm of platinum atoms relative to the silicone component, and the mixture was then stirred thoroughly, yielding a white paste with a viscosity of 20 Pa·s.

Example 2

The silicone base 1 was prepared in the same manner as example 1, and to 100 parts by mass of this silicone base 1 were added 50 parts by mass of the same titanium oxide powder (b1) used in example 1, 90 parts by mass of an alumina powder (c2) having an average particle size of 4.0 μm (product name: AL-43PC, manufactured by Showa Denko K.K.), and the same platinum catalyst (D1) used in example 1, in sufficient amount to provide the equivalent of 10 ppm of platinum atoms relative to the silicone component. The mixture was then stirred thoroughly, and 3 parts by mass of a hydrocarbon solvent with a boiling point of at least 200° C. was added, yielding a white paste with a viscosity of 20 Pa·s.

Example 3

A mixture containing 45.8 g of vinylmethyldichlorosilane, 111.0 g of phenyltrichlorosilane (molar ratio 38:62) (average composition of mixture: $(CH_3)_{0.38}(C_6H_5)_{0.62}(CH_2=CH)_{0.38}SiO_{1.31}$) and 20 g of toluene was added gradually, in a dropwise manner, to a mixture of 120 g of toluene and 320 g of water being stirred inside a flask, with the addition controlled so that the temperature inside the flask did not exceed 50° C., thereby effecting a cohydrolysis. A polycondensation was then conducted by continuing the reaction at not more than 70° C. for two hours, thus forming a toluene solution of a three dimensional network structure organopolysiloxane (silicone resin) (P1) that exhibited a non-volatile component of 70% when heated for 30 minutes at 150° C. The solid fraction (P1) within this solution existed in a non-fluid gum-like state at 25° C. This organopolysiloxane solution was stripped for one hour under conditions of 80° C. and 15 mmHg, and to 100 parts by mass of the resulting organopolysiloxane component were added 43 parts by mass of a methylhydrogenpolysiloxane (Q1) represented by the formula (4): $R'_cH_dSiO_{(4-c-d)/2}$ wherein R' represents a methyl group, c=1.67 and d=0.67, having a viscosity at 25° C. of 30 mPa·s, and 10 parts by mass of a hydrogensiloxane having an epoxy group and methoxy groups, represented by a formula (6) shown below, thus obtaining a transparent liquid with a viscosity at room temperature of 5.0 Pa·s (silicone base 2, molar ratio of total SiH groups relative to total alkenyl groups within the composition: 0.91).

(6)

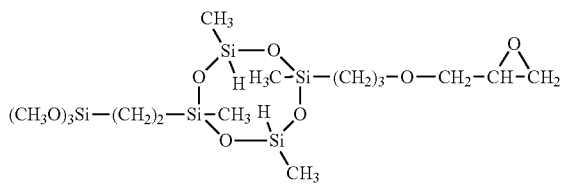

To 100 parts by mass of this silicone base 2 were added 60 parts by mass of the same titanium oxide powder (b1) used in example 1, 12 parts by mass of the same crystalline silica (c1) used in example 1, and a platinum catalyst (D1) derived from chloroplatinic acid and having tetramethylvinyldisiloxane as a ligand, in sufficient amount to provide the equivalent of 10 ppm of platinum atoms relative to the silicone component, and the mixture was then stirred thoroughly, yielding a white paste with a viscosity of 10 Pa·s.

Comparative Example 1

With the exception of not adding the titanium oxide powder of the component (b), a white paste having a viscosity of 15 Pa·s was prepared in the same manner as example 1.

Comparative Example 2

With the exception of not adding the alumina powder of the component (c), a white paste having a viscosity of 10 Pa·s was prepared in the same manner as example 2.

Each of the white pastes prepared in the manner described above was subjected to the tests described below. The results of these tests are shown in Table 1.

i. Hardness of Cured Product of Component (a):

With the exception of not adding the components (b) and (c), pastes were prepared in the same manner as each of the examples and comparative examples, and each paste was heated for three hours at 150° C. The type D hardness of the resulting cured product was measured in accordance with JIS K6253.

ii. Concealment:

Each of the white pastes was applied to a glass plate, a 1 mm square silicon wafer fragment of thickness 300 μm was pressed onto the paste, the wafer fragment was observed from beneath the glass plate, and the degree of concealment was evaluated visually. The evaluation was made against the following criteria.

OO: the wafer is completely obscured (the degree of concealment is large)

O: the wafer is faintly visible (the degree of concealment is fair)

x: the wafer is clearly visible (the paste offers no concealment)

iii. Adhesive Strength

Each white paste was applied to a test piece prepared by silver plating a flat sheet of nickel, a 1 mm square silicon wafer fragment of thickness 300 μm was pressed onto the paste, and following curing of the paste by heating at 150° C. for three hours, the die shear strength was measured using a die bond tester.

TABLE 1

|  | Example 1 | Example 2 | Example 3 | Comparative example 1 | Comparative example 2 |
| --- | --- | --- | --- | --- | --- |
| Hardness (type D) | 55 | 55 | 75 | 55 | 55 |
| Concealment | o | oo | o | x | x |
| Adhesive strength (g) | 2000 | 2100 | 3500 | 1800 | 1700 |

What is claimed is:

1. A light emitting device comprising a gold-plated substrate, a light emitting element and a cured resin layer interposed between the gold-plated substrate and the light emitting element, wherein said cured resin layer comprises a cured product of a silicone adhesive comprising components (a), (b), and (c):

(a) an addition reaction-curable silicone resin composition, having a viscosity at 25° C. of not more than 100 Pa·s, and yielding a cured product upon heating at 150° C. for 3 hours that has a type D hardness prescribed in JIS K6253 of at least 30,
(b) a white pigment powder having an average particle size of less than 1 μm and
(c) a white or colorless and transparent powder having an average particle size of at least 1 μm but less than 10 μm wherein
a combination of components (b) and (c) is present in an amount of 12 to 600 parts by mass per 100 parts by mass of component (a).

2. The light emitting device according to claim 1, wherein said cured resin layer comprises a cured product of a white silicone adhesive comprising components (a), (b) and (c):
(a) an addition reaction-curable silicone resin composition, having a viscosity at 25° C. of not more than 100 Pa·s, and yielding a cured product upon heating at 150° C. for 3 hours that has a type D hardness prescribed in JIS K6253 of at least 30,
(b) a titanium oxide powder having an average particle size of less than 1 μm, and
(c) at least one powder selected from the group consisting of an alumina powder and a crystalline silica powder and having an average particle size of at least 1 μm but less than 10 μm, wherein
a combination of components (b) and (c) is present in an amount of 12 to 600 parts by mass per 100 parts by mass of component (a), and
the blend mass ratio of component (b) to component (c) is within a range from 0.1 to 20,
wherein component (a) comprises components (A), (B), (C) and (D):
(A) a linear organopolysiloxane having at least two alkenyl groups bonded to silicon atoms within each molecule, and having a viscosity at 25° C. of not more than 1,000 mPa·s,
(B) a polyorganosiloxane represented by an average composition formula (1):

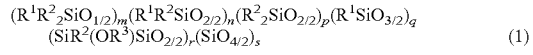

$(R^1R^2_2SiO_{1/2})_m(R^1R^2SiO_{2/2})_n(R^2_2SiO_{2/2})_p(R^1SiO_{3/2})_q(SiR^2(OR^3)SiO_{2/2})_r(SiO_{4/2})_s$ (1)

wherein $R^1$ represents an alkenyl group or a monovalent hydrocarbon group other than an alkenyl group; $R^2$ represents a monovalent hydrocarbon group that does not contain an alkenyl group, provided that at least 80% of $R^2$ groups are methyl groups; $R^3$ represents a hydrogen atom or an alkyl group; m, n, p, q, r and s are numbers that satisfy m≥0, n≥0, p≥0, q≥0, r≥0 and s≥0 respectively, provided that m+n>0, q+r+s>0, and m+n+p+q+r=1,
which at 25° C. is either a liquid having a viscosity of at least 1,000 Pa·s or a solid, in an amount that provides 60 to 90 parts by mass of component (B) per 100 parts by mass of a combination of component (A) and component (B),
(C) an organohydrogenpolysiloxane represented by an average composition formula (2):

$R^4_aH_bSiO_{(4-a-b)/2}$ (2)

wherein $R^4$ represents a monovalent hydrocarbon group other than an alkenyl group, and at least 50% of $R^4$ groups are methyl groups; and a and b are positive numbers that satisfy 0.7≤a≤2.1, 0.001≤b≤1.0 and 0.8≤a+b≤3.0,
having at least two SiH bonds within each molecule, and having a viscosity at 25° C. of not more than 1,000 mPa·s, in an amount that yields a total number of SiH bonds that is 0.5 to 5.0 times a total number of alkenyl groups within a combination of component (A) and component (B), and (D) an effective amount of a platinum group metal-based catalyst, and wherein the white silicone adhesive is present in cured state on the light emitting device that comprise gold electrode.

3. The light emitting device according to claim 1, wherein component (c) comprises alumina.

4. The light emitting device according to claim 3, wherein component (c) is an alumina powder composed of alumina particles with a shape of flake.

5. The light emitting device according to claim 2, wherein the organopolysiloxane of component (A) is a linear organopolysiloxane having at least two alkenyl groups bonded to silicon atoms within each molecule, in which a main chain comprises repeating diorganosiloxane units, and both molecular chain terminals are blocked with triorganosiloxy groups.

6. The light emitting device according to claim 2, wherein an amount of alkenyl groups is within a range from 0.01 to 1 mol/100 g relative to a solid fraction of component (B).

7. The light emitting device according to claim 2, wherein an amount of component (B) is within a range from 70 to 80 parts by mass relative to 100 parts by mass of a combination of component (A) and component (B).

8. The light emitting device according to claim 1, wherein the blend mass ratio of component (b) to component (c) is within a range from 0.2 to 10.

9. The light emitting device according to claim 1, wherein the blend mass ratio of component (b) to component (c) is within a range from 0.5 to 5.

10. The light emitting device according to claim 1, wherein a combination of components (b) and (c) is present in an amount of 25 to 350 parts by mass per 100 parts by mass of component (a).

11. The light emitting device according to claim 1, wherein a combination of components (b) and (c) is present in an amount of 40 to 350 parts by mass per 100 parts by mass of component (a).

12. The light emitting device according to claim 1, wherein a blend amount of component (c) is from 2 to 400 parts by mass, per 100 parts by mass of component (a).

13. The light emitting device according to claim 1, wherein a blend amount of component (c) is from 5 to 200 parts by mass, per 100 parts by mass of component (a).

14. The light emitting device according to claim 2, wherein component (D) comprises at least one member selected from the group consisting of platinum black; rhodium palladium; a platinum chloride; a chloroplatinic acid; a chloroplatinate; an alcohol-modified chloroplatinic acid; a complex of chloroplatinic acid and an olefin; platinum black supported on alumina, silica or carbon; palladium supported on alumina, silica or carbon; a rhodium-olefin complex; chlorotris(triphenylphosphine)rhodium; and a complexes of platinum chloride, chloroplatinic acid or a chloroplatinate with a vinyl group-containing siloxane.

15. The light emitting device according to claim 2, wherein component (D) comprises a silicone-modified chloroplatinic acid.

16. The light emitting device according to claim 2, wherein component (D) comprises chloroplatinic acid modified with tetramethylvinyldisiloxane.

17. The light emitting device according to claim 2, wherein component (A) comprises at least one member selected from the group consisting of

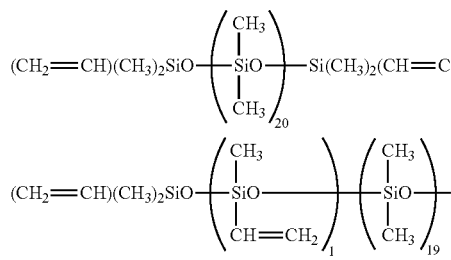
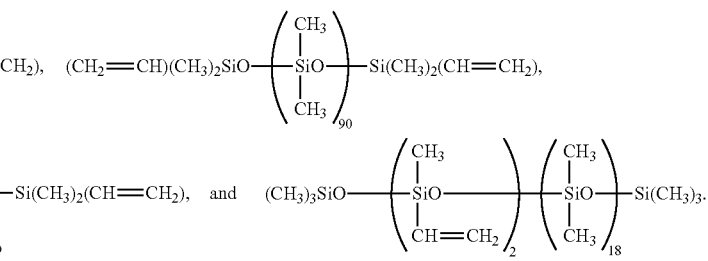

18. The light emitting device according to claim 2, wherein component (C) is present in an amount that yields a total number of SiH bonds that is 0.7 to 3.0 times a total number of alkenyl groups within a combination of component (A) and component (B).

19. The light emitting device according to claim 2, wherein the organohydrogenpolysiloxane of component (C) comprises 4 to approximately 50 SiH groups within each molecule that are positioned either at the molecular chain terminals or at non-terminal positions within the molecular chain or are positioned at the molecular chain terminals and at non-terminal positions within the molecular chain.

20. The light emitting device according to claim 2, wherein component (C) comprises at least one member selected from the group consisting of 1,1,3,3-tetramethyldisiloxane; 1,3,5,7-tetramethylcyclotetrasiloxane; tris(hydrogendimethylsiloxy)methylsilane; tris(hydrogendimethylsiloxy)phenylsilane; methylhydrogencyclopolysiloxane; a cyclic copolymer of methylhydrogensiloxane and dimethylsiloxane; a methylhydrogenpolysiloxane with both molecular chain terminals blocked with trimethylsiloxy groups; a copolymer of dimethylsiloxane and methylhydrogensiloxane with both terminals blocked with trimethylsiloxy groups; a dimethylpolysiloxane with both terminals blocked with dimethylhydrogensiloxy groups; a methylhydrogenpolysiloxane with both terminals blocked with dimethylhydrogensiloxy groups; a copolymer of dimethylsiloxane and methylhydrogensiloxane with both terminals blocked with dimethylhydrogensiloxy groups; a copolymer of methylhydrogensiloxane and diphenylsiloxane with both terminals blocked with trimethylsiloxy groups; a copolymer of methylhydrogensiloxane; a diphenylsiloxane and dimethylsiloxane with both terminals blocked with trimethylsiloxy groups; a copolymer of methylhydrogensiloxane, methylphenylsiloxane and dimethylsiloxane with both terminals blocked with trimethylsiloxy groups; a copolymer of methylhydrogensiloxane, dimethylsiloxane, and diphenylsiloxane with both terminals blocked with dimethylhydrogensiloxy groups; a copolymer of methylhydrogensiloxane, dimethylsiloxane and methylphenylsiloxane with both terminals blocked with dimethylhydrogensiloxy groups; a copolymer comprising $(CH_3)_2HSiO_{1/2}$ units, $(CH_3)_3SiO_{1/2}$ units and $SiO_{4/2}$ units, a copolymer comprising $(CH_3)_2HSiO_{1/2}$ units and $SiO_{4/2}$ units, and a copolymers comprising $(CH_3)_2HSiO_{1/2}$ units, $SiO_{4/2}$ units and $(C_6H_5)_3SiO_{1/2}$ units.

* * * * *